(12) United States Patent
Nakamura et al.

(10) Patent No.: US 6,265,323 B1
(45) Date of Patent: Jul. 24, 2001

(54) SUBSTRATE PROCESSING METHOD AND APPARATUS

(75) Inventors: Hiroko Nakamura; Shinichi Ito; Katsuya Okumura, all of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/255,659

(22) Filed: Feb. 23, 1999

(30) Foreign Application Priority Data

Feb. 23, 1998 (JP) .................................................. 10-057502

(51) Int. Cl.⁷ ................................................. H01L 21/302
(52) U.S. Cl. ..................... 438/748; 438/745; 438/746; 438/747
(58) Field of Search ................................... 438/745, 747, 438/746, 748

(56) References Cited

U.S. PATENT DOCUMENTS

| | | | |
|---|---|---|---|
| 5,437,733 | * 8/1995 | Okumura | 134/34 |
| 5,478,435 | * 12/1995 | Murphy et al. | 156/636.1 |
| 5,674,410 | * 10/1997 | Nakajima et al. | 216/92 |
| 5,897,576 | * 3/1999 | Wada et al. | 216/91 |
| 5,952,242 | * 9/1999 | Pietsch et al. | 438/692 |
| 6,027,602 | * 2/2000 | Hung et al. | 156/345 |
| 6,059,920 | * 5/2000 | Nojo et al. | 156/345 |

FOREIGN PATENT DOCUMENTS

| | | |
|---|---|---|
| 57-117237 | 7/1982 | (JP) . |
| 57-208134 | 12/1982 | (JP) . |
| 5-347032 | 12/1993 | (JP) . |
| 7-235473 | 9/1995 | (JP) . |
| 8-102436 | 4/1996 | (JP) . |
| 11-109648 | 4/1999 | (JP) . |

\* cited by examiner

*Primary Examiner*—Benjamin L. Utech
*Assistant Examiner*—Charlotte A. Brown
(74) *Attorney, Agent, or Firm*—Finnegan, Henderson, Farabow, Garrett & Dunner, L.L.P.

(57) ABSTRACT

Disclosed herein is a method for processing a substrate. The method includes supplying a liquid agent such as a developer onto the surface of a substrate, bringing an upper surface of a film formed of the liquid agent into contact with a liquid agent holding member arranged so as to face the substrate, holding the liquid agent between the substrate and the liquid agent holding member, moving the substrate or the liquid agent holding member, or both, in parallel to the main surface of the substrate, while the main surface of the substrate is being treated with the liquid agent. Since the concentrations of reaction products and starting reaction materials become uniform in the liquid agent which contacts the substrate, the entire substrate can be processed uniformly.

15 Claims, 11 Drawing Sheets

SUBSTRATE PROCESSING METHOD AND APPARATUS

BACKGROUND OF THE INVENTION

The present invention relates to a substrate processing method and apparatus for use in a semiconductor device, a liquid crystal display and the like. More specifically, the present invention relates to a method and apparatus for processing a substrate by using a liquid agent.

In the semiconductor device and liquid crystal display, desired functions can be imparted by applying various types of processing to a substrate and forming a micro pattern on the substrate. To process the substrate as mentioned above, not only a dry process using a gas but also a wet process using a liquid agent is widely employed. The wet processing is performed to develop a photosensitive resist pattern, which will be used to form a micro pattern.

To form a photosensitive resist pattern, a photosensitive resist is applied on a film which has been formed on a silicon or quartz substrate, thereby forming a photoresist film. An exposure mask is placed above the photoresist film. Light is applied through the mask, whereby a desired region of the resist film is exposed to light. Subsequently, the light-exposed portion of the resist film, if the resist film is a positive type one, or the non light-exposed portion, if the resist film is a negative type one, is removed with an organic solvent or an aqueous alkaline solution. As a result, a photosensitive resist pattern is formed.

To form a chromium mask for use in light exposure, the wet process is applied. After the chromium film is formed on a substrate, a photosensitive resist pattern is formed. Those parts of the chromium film which are not covered with the resist pattern are isotropically removed by the wet-etching using a ceric nitrate ammonium solution.

To remove unnecessary organic materials from a substrate prior to processing, or to remove the photosensitive resin pattern from a substrate after completion of etching, a mixed liquid agent consisting of sulfuric acid and hydrogen peroxide is used.

If a silicon substrate is reacted with oxygen contained in the air, a native oxide film will be formed. Since the native oxide film prevents uniform processing, it must be removed. To remove the native oxide film, a liquid agent such as $NH_4$ or diluted HF is applied.

In the case where a gold film is formed on a silicon substrate, an Au plating solution is used.

Wet processing methods include a dip treatment in which the substrate is dipped in a liquid agent, and a puddle treatment in which the substrate is treated with a liquid agent supplied to the main surface of the substrate. However, the dip treatment has problems in that a large amount of the liquid agent is required and in that the substrate may be contaminated with a material present in the rear surface. Because of the problems, the paddle treatment tends to be widely employed rather than the dip treatment. To perform the puddle treatment, the substrate is fixed at the back by a vacuum chuck (Jpn. Pat. Appln. KOKAI Publication No. 7-235473).

In the wet treatment, the treatment is performed through a chemical reaction between a liquid agent and the film to be treated. As the treatment proceeds, the concentration of reaction products increases, whereas that of the starting liquid agent decreases. Since the reaction products and the starting liquid agents do not diffuse immediately, their concentrations varies locally. Consequently, the surface of the film cannot always be processed uniformly.

In a developing method, for example, resist is removed from a desired region of the substrate with an aqueous alkaline solution and is dissolved by a neutralization reaction with the developer (aqueous alkaline solution). This is because the resin forming a resist removal region has an acidic group such as a carboxylic acid or a phenol group as a side chain. The substrate is brought to a standstill in a conventional development step, so that the dissolved resin diffuses slowly. As a result, the dissolved resin is left near the resist removal region. In addition, an OH group does not diffuse sufficiently fast. The concentration of the OH group is therefore locally low after the OH group is consumed in the neutralization reaction. This reduces local pH. The volume of the resin in the removal region, i.e., the amount of the resin to be dissolved, depends on a pattern. Hence, the dimensions of the photosensitive resist finally left on the substrate surface is not uniform.

Then, the aforementioned publication No. 7-235473 discloses the following method using a rotation-type resist developing apparatus. In this apparatus, a capillary action is induced in the treatment solution between the wafer and the liquid agent supply board located in proximity of the wafer. The time required for dispersing the treatment solution over the resist film can, therefore, be reduced by the capillary action and thereby uneven development decreases. However, in this method, development is carried out at a predetermined time interval after the developer is dispersed over the entire surface of the resist film. Thus, the local change in pH of the developer inevitably occurs, as mentioned above.

In the case where the developing process is performed while stirring the developer, an ultrasonic oscillator is employed as disclosed in a method of Jpn. Pat. Appln. KOKAI Publication No. 57-208134. However, when the ultrasonic oscillator is used, voids are produced or destroyed in the liquid agent by the cavitation effect due to the oscillation. Since the substrate has larger acoustic impedance than the liquid agent, the void tends to form, especially on the substrate. Due to voids, the liquid agent does not always contact the substrate. As a consequence, the substrate surface cannot be processed uniformly.

BRIEF SUMMARY OF THE INVENTION

The present invention relates to a substrate processing method and apparatus for treating a substrate with a liquid agent. The object of the present invention resides in that reaction products and starting reaction materials are present in uniform concentrations in the liquid agent in contact with a entire surface of the substrate, and that the substrate can be processed uniformly over its surface after it has been treated.

A main feature of the present invention resides in that a substrate or a liquid agent holding member, or both are moved in parallel to the main surface of the substrate during the treatment with the liquid agent while the liquid agent remains in contact with the liquid agent holding member. The liquid agent is thereby stirred. The reaction products and the starting reaction materials are therefore present in uniform concentrations in the liquid agent which contacts the surface of the substrate. As a result, the substrate can be processed, over its surface, with uniform accuracy after it has been treated. In addition, since the liquid agent is stirred, it is possible to prevent the reaction products from accumulating near the substrate surface and to maintain the concentration of the starting reaction materials. The processing rate therefore can be improved.

To attain the aforementioned object, the substrate processing method according to a first aspect of the present invention comprises:

a first step of supplying a liquid agent onto a main surface of a substrate;

a second step of holding the liquid agent between the substrate and a liquid agent holding member by bringing an upper surface of a film of the liquid agent in contact with the liquid agent holding member which faces the substrate; and a third step of moving at least one of the substrate and the liquid agent holding member in parallel to the main surface of the substrate, after the second step, in order to treat uniformly the main surface of the substrate with the liquid agent.

The second step may include a step of using a liquid agent supply nozzle as the liquid agent holding member.

The first step desirably includes a step of applying the liquid agent, by use of a disc nozzle with plural liquid agent outlet holes or by use of a linear nozzle which has a linear developer supply section whose length is almost the same as a diameter of the wafer while rotating the substrate or moving the linear nozzle from one end of the substrate to the other in parallel to the main surface of the substrate which is at a sandstill.

It is desirable that the second step include a step of moving the liquid agent holding member so as to face the substrate and bringing the liquid agent holding member in contact with an upper surface of the film of the liquid agent.

It is desirable that the third step include a step of performing reciprocating movement or rotational movement.

It is desirable that the rotational movement include rotating the substrate while the liquid agent holding member is immobilized.

It is desirable that the velocity of the rotational movement is 10 to 50 rpm.

It is desirable that the first step include a step of forming a single liquid-agent film on a surface of the liquid agent supply nozzle facing the substrate, supplying the liquid agent to the main surface of the substrate in the form of film, and using the liquid agent supply nozzle as the liquid agent holding member.

The first step may include a step of supplying the liquid agent to an entire surface of the substrate substantially at the same time.

The first step may include a step of supplying the liquid agent by using the liquid agent supply nozzle having the surface made in a convex form.

The first step may include a step of supplying the liquid agent onto the main surface of the substrate while a substrate surface facing the liquid agent supply nozzle remains in a convex form.

The first step may include a step of supplying the liquid agent while reducing pressure in a space provided between the substrate and the liquid agent supply nozzle.

The liquid agent may be one selected from the group consisting of a developer, an etching solution, a washing solution, a remover agent, a film formation solution and a plating liquid.

It is desirable that the substrate processing method further comprise a step of simultaneously rinsing the liquid agent holding member and the main surface of the substrate by replacing the liquid agent with a rinse solution after the third step.

The reciprocating movement or rotational movement in parallel to the main surface of the substrate may be performed by any one of the steps: (a) the liquid agent holding member is moved while the substrate is fixed; (b) the substrate and the liquid agent holding member are relatively moved to each other in the same direction; (c) the substrate and the liquid agent holding member are relatively moved in a reverse direction to each other; and (d) the substrate or the liquid agent holding member is moved back and forth, while the other is rotated.

The substrate processing apparatus according to a second aspect of the present invention comprises:

a table on which a substrate is to be mounted;

a liquid agent supply nozzle for supplying a liquid agent onto a main surface of the substrate;

a liquid agent holding member facing the substrate and movable up and down in order to be in contact with an upper surface of the film-form liquid agent; and a mechanism for moving at least one element of the substrate and the liquid agent holding member in parallel to the main surface of the substrate while the liquid agent holding member is in contact with the upper surface of the film-form liquid agent.

The liquid agent supply nozzle may serve as the liquid agent holding member.

The mechanism desirably includes a reciprocating drive mechanism or a rotational drive mechanism.

The liquid agent supply nozzle desirably has a plurality of liquid agent outlet holes in a surface facing the substrate, any two of the liquid agent outlet holes adjacent to each other in a moving direction of the substrate passing through different regions of the substrate when the nozzle moves relative to the substrate.

The liquid agent supply nozzle has a plurality of liquid agent outlet holes in a surface facing the substrate, the liquid agent outlet holes being uniformly distributed in a plane facing the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, embodiments of the present invention will be explained with reference to the accompanying drawings.

Embodiment 1

Figure 1:
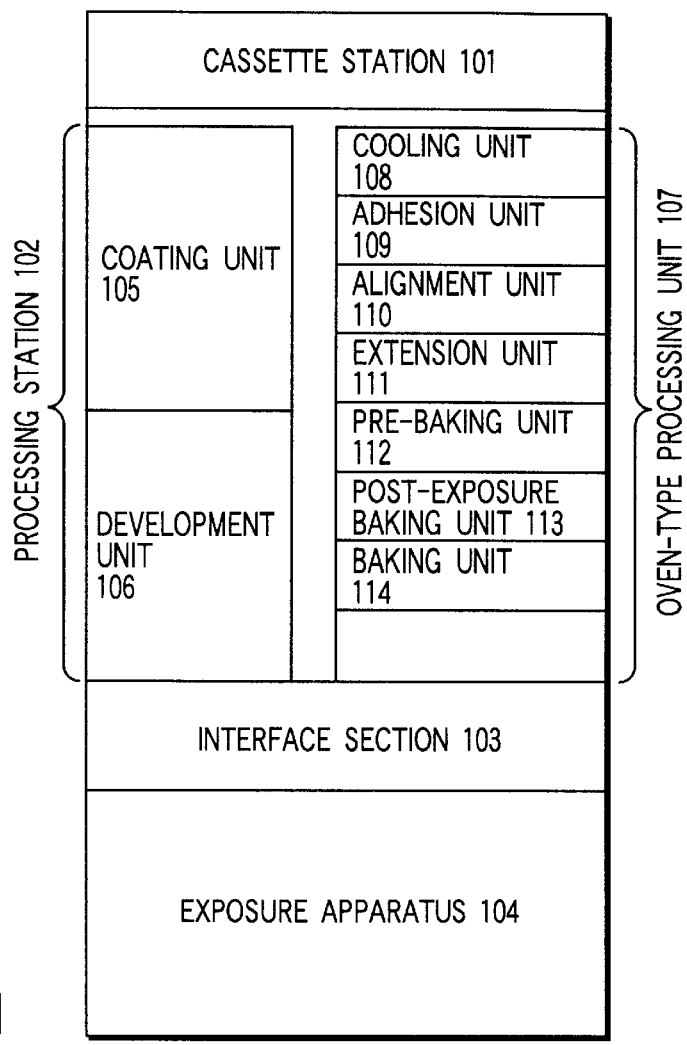
FIG. 1 is an example of an entire structure of a system of a coating/developing apparatus of the present invention including peripheral units.

In the developing step of a photosensitive resist pattern of this embodiment, a developer supply nozzle is used as a liquid agent holding member, and a developer is stirred by rotational motion in a direction parallel to a wafer surface. FIG. 1 shows an example of a system used in Embodiment 1. The system comprises a coating/developing apparatus and peripheral apparatuses (exposure apparatus and the like).

The coating/developing apparatus is composed of a cassette station 101, a processing station 102, and an interface section 103. The coating/developing apparatus 104 is connected to an exposure apparatus 104 by the interface section 103.

The cassette station 101 is designed to load and unload a wafer cassette (not shown) into and from the system. The wafer cassette stores a plurality of substrates, more specifically, semiconductor wafers (not shown, hereinafter referred to as "wafers"). The cassette holds, for example, 25 wafers at a time. The cassette station 101 is designed also to load wafers from the wafer cassette into the processing station 102, and vise versa.

The process station 102 has various single wafer processing units, each designed to process one wafer at a time in the developing and coating steps. The processing units are arranged one above another, in stages. Each processing unit processes wafers, one by one. The process station 102 is composed of a coating unit 105, a development unit 106, and an oven-type processing unit 107. The coating unit 105 and the development unit 106 are spinner type units, in which a predetermined treatment is applied to the wafer mounted on a spin chuck placed in a cup. The unit 105 coats a wafer with a resist film and an anti-reflection film. The unit 106 develops the resist film.

The oven-type processing unit 107 is designed to perform a predetermined treatment on the wafer mounted on a table. The unit 107 includes a cooling unit 108, an adhesion unit 109, an alignment unit 110, an extension unit 111, a pre-baking unit 112, a post-exposure baking unit 113, and a baking unit 114. These units 108 to 114 are stacked, one upon another. The cooling unit 108 cools wafers. The adhesion unit 109 performs hydrophobic treatment to enhance resist adhesion. The alignment unit 110 is designed to align wafers. The pre-baking unit 112 is provided for heating wafers prior to light exposure. The post-exposure baking unit 113 is used to heat wafers after light exposure treatment. In the interface section 103, wafers are transferred from the processing station 102 to the exposure apparatus 104, and vice versa.

The wafer is processed as follows. At first, a predetermined number of wafers are loaded into the wafer cassette. The wafer cassette holding the wafers is set at the cassette station 101. A wafer is transported from the cassette station 101 to the cooling unit 108 which is provided in the oven-type processing unit 107. The wafer is cooled in the cooling unit 108 for 40 seconds and then transported to the anti-reflection film coating unit 105. In the unit 105, the wafer is coated with an anti-reflection film having a thickness of 60 nm. The wafer is further transported to the baking unit 114 heated to 175° C. within the oven-type processing unit 107. In the baking unit 114, the wafer is heated for 60 seconds.

Thereafter, the wafer is transported to the cooling unit 108 and cooled at 23° C. for 60 seconds. The wafer thus cooled is transported to the resist coating unit 105. In the unit 105, resist is applied onto the wafer, and a positive type photosensitive resist is applied onto the wafer, forming a film having a thickness of 0.3 µm. Thereafter, the wafer is transported to the pre-baking unit 112 heated to 100° C. which is provided in the oven-type process unit 107. In the unit 112, the wafer is pre-baked 90 seconds.

The wafer thus pre-baked is transported to the cooling unit 108 and is cooled at 23° C. for 60 seconds. The wafer is then transferred to the interface section 103 and then loaded into the exposure apparatus 104. The wafer is exposed to light under normal conditions: NA=0.55, σ=0.55. Thereafter, the wafer is introduced into the coating/developing apparatus through the interface section 103 and then heated at 100° C. for 90 seconds in the post exposure baking unit 113.

The development unit according to this embodiment will be described.

Figure 2:
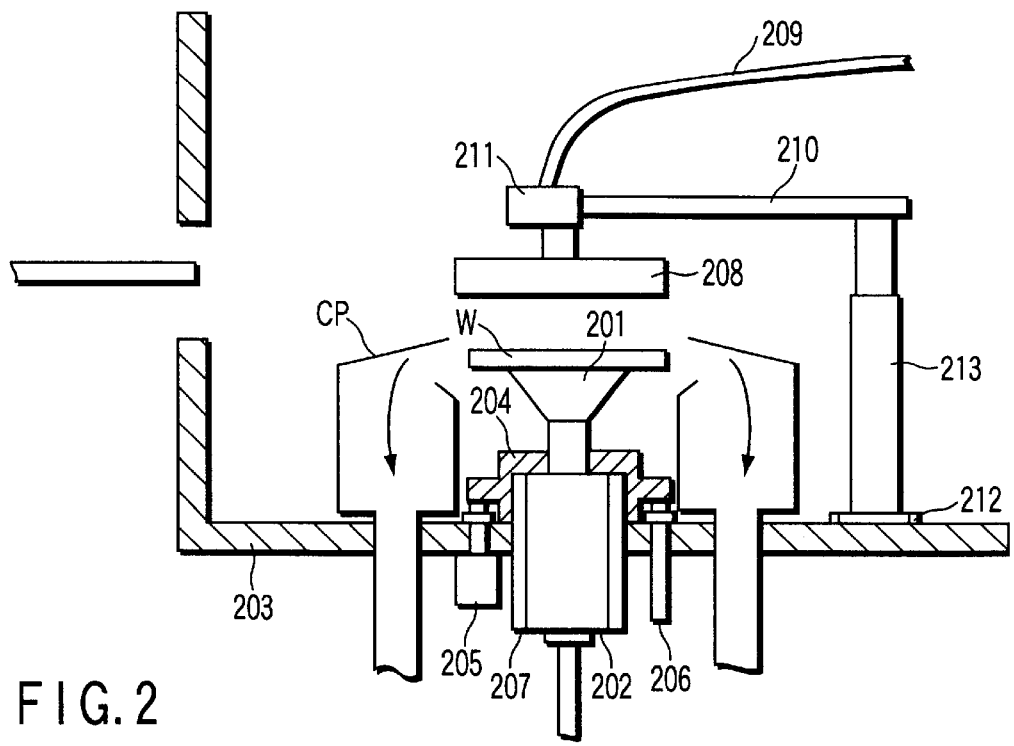
FIG. 2 is a schematic cross-sectional view of a development unit according to Embodiment 1 of the present invention.
Figure 3:
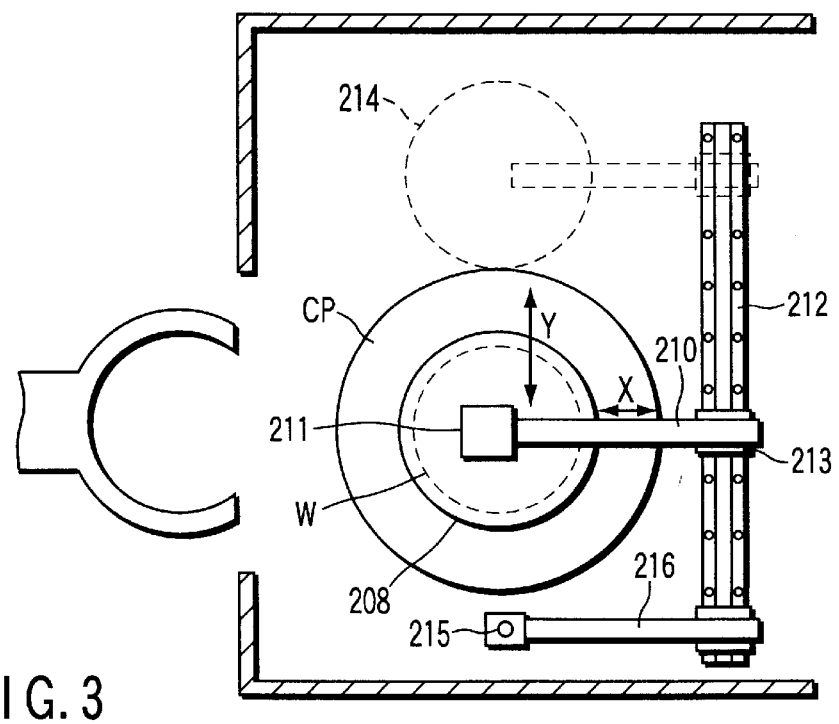
FIG. 3 is a schematic plan view of a development unit according to Embodiment 1 of the present invention.

FIGS. 2 and 3 are, respectively, cross-sectional views and plan view of the developing unit incorporated in the coating/developing apparatus of the present invention. A circular cup CP is provided at a center portion of the development unit. The cup CP contains a spin chuck 201. A motor 202 is provided to rotate the spin chuck 201, while the wafer is held by vacuum adsorption. The driving motor 202 is fitted in an opening made in the bottom plate 203 of the developing unit. The motor 202 is connected to a driving means 205 (including, for example, an air cylinder) and a guiding means 206 by a cap-shaped aluminum flange member 204. Hence, the motor 202 can be moved up and down. A cylinder-form cooling jacket 207 made of, e.g., SUS, is fixed to a side of the driving motor 202. The flange member 204 is fixed, covering the half of the cooling jacket 207.

To apply the developer to the wafer, the lower edge of the flange member 204 is brought into airtight contact with the outer periphery of the opening made in the unit bottom plate 203. The developing unit is thereby sealed airtight. To transfer the wafer W between the spin chuck 201 and the wafer transfer mechanism (not shown), the flange member 204 is lifted apart from the unit bottom plate 203 by the driving means 205. In this manner, the driving motor 202 and the spin chuck 201 are lifted, together with the flange member 204.

A developer supply pipe 209 connects a developer supply nozzle 208 to a developer source (not shown). Developer can therefore be supplied from the nozzle 208 to the surface of the wafer surface. The nozzle 208 is removably attached to a distal end of a nozzle scan arm 210 by a nozzle holder 211. The scan arm 210 is secured to an upper end of a vertical support member 213. The support member 213 can move along a guide rail 212, which is provided on the unit bottom plate 203 in a direction Y direction. Thus, the member 213 can move in the Y direction when driven by a Y-direction drive mechanism (not shown).

The developer supply nozzle 208 has substantially the same shape as the wafer W, as is shown in FIG. 3. More specifically, the developer supply nozzle 208 is shaped like a disk, slightly larger than the wafer W. While the wafer W is being rotated, the developer is supplied from the disk-shaped developer supply nozzle (disk nozzle) 208, over the entire surface of the wafer W. The nozzle 208 is attached to the distal end of the nozzle scan arm 210, as described above. The nozzle 208 moves back and forth on the guide rail 212 in the Y direction, between a position, where it faces the wafer W, and a stand-by position 214. The stand-by position 214 is at a side of the wafer W, as is illustrated in FIG. 3. Instead, the stand-by position 214 may be provided above the wafer W.

A rinse nozzle 215 is provided for discharging a washing solution. The rinse nozzle 215 is secured to a distal end of the nozzle scan arm 216, which can move on the guide rail 212 in the Y direction. After completion of the developing process with the developer, the rinse nozzle 215 is moved over the wafer W to apply the washing solution to the wafer W.

How the developing process is performed in the developing unit 106 will be explained.

After the post exposure baking process described above, the wafer W is transferred to the developing unit 106 (FIG. 1). In the unit 106, the wafer is fixed onto the spin chuck 201. The developer supply nozzle 208, which has substantially the same shape as the wafer W, is located above the wafer W and faces the wafer W. The nozzle 208 has a plurality of holes of 0.5 mm in diameter, in the surface that opposes the wafer W. The holes are arranged at intervals of 4 mm. The nozzle 208 is spaced by a distance of 2 mm from the upper surface of the wafer W.

First, the disk-shaped developer supply nozzle 208 applies the developer to the entire surface of the wafer W, while the wafer W is being rotated at 60 rpm. A developer film is thereby formed on the wafer W to a thickness of 2 mm.

Figures 4A, 4B:
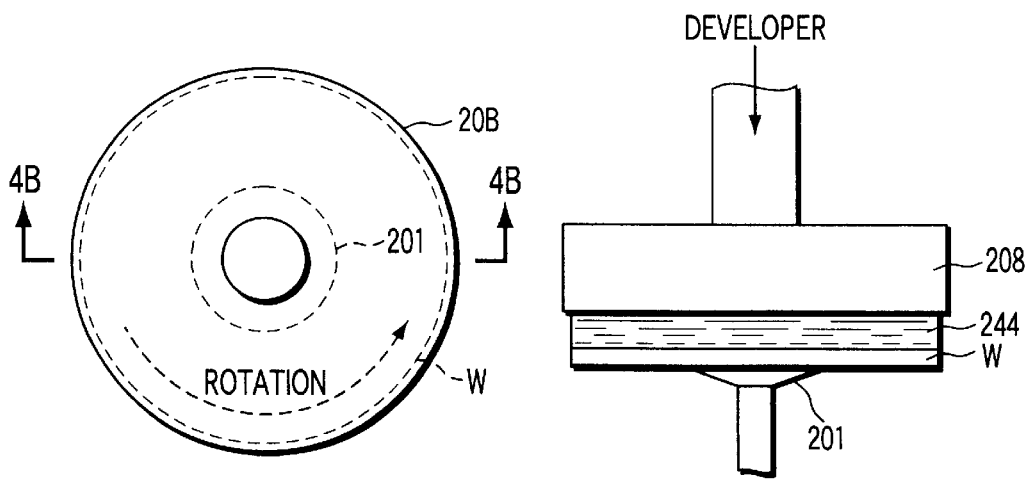
FIG. 4A is a perspective plan view of a disk nozzle of the development unit according to Embodiment 1.
FIG. 4B is a cross sectional view taken along the line 4B—4B of FIG. 4A.

The state at this time point is shown in FIGS. 4A and 4B. FIG. 4A is a partial perspective plan view of the development unit. FIG. 4B is a cross-sectional view of the development unit taken along the line 4B—4B of FIG. 4A. The space between the disk nozzle 208 and the wafer W is filled with the developer in the form of the developer film 244, and thus the lower surface of the disk nozzle 208 comes into contact with the upper surface of the developer film 244.

Next, development is performed for 60 seconds, from the start of the application of developer to the start of application of rinse solution supply. During the development, the wafer is rotated at 30 rpm and the disk nozzle 208 remains at a standstill. Thereafter, the disk nozzle 208 is lifted to the stand-by position 214 as shown in FIG. 3.

Then, the rinse nozzle 215 is moved to the center of the wafer W. The wafer W is rotated at 2000 rpm. The developer is thereby removed from the wafer. At the same time, the rinse solution is applied, and the development step is terminated. Thereafter, the wafer is rotated at 500 rpm to wash the wafer W. Finally, the supply of the rinse solution is terminated. The wafer W is rotated at 2000 rpm again, removing the rinse solution from the wafer W. Thus, the wafer W is dried.

Figure 5:
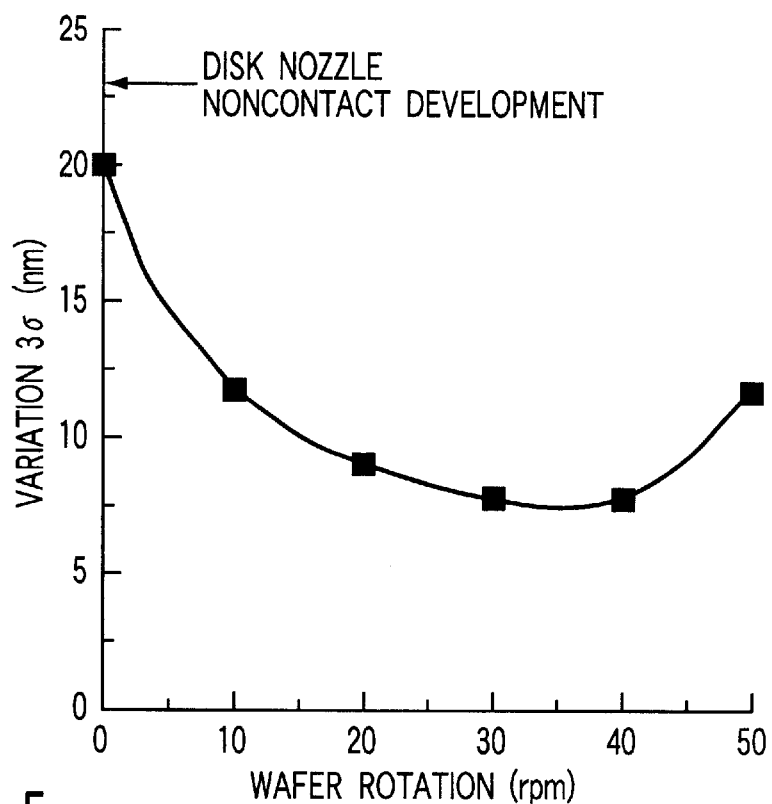
FIG. 5 is a characteristic graph showing the dependency of the measured dimensions of patterns on a wafer upon the wafer rotation velocity, in Embodiment 1.

As a result, a 0.225 µm L&S (line and space) pattern is formed. The line width (critical dimension) of the L&S pattern thus formed is measured all over the wafer and the line width (dimension) variation (3σ) is calculated. FIG. 5 shows the dependence of the variation 3σ on the rotation velocity at which the wafer W is rotated while the developer film remains in contact with the lower surface of the nozzle during development. In FIG. 5, the Y axis indicates the dimension variation 3σ (nm), and the X axis indicates the rotational velocity (rpm). As seen from FIG. 5, the dimension variation 3σ has the minimum value of 8 nm when the wafer is rotated at a rotational velocity ranging from 30 rpm to 40 rpm during the development. If the wafer W is not moved at all, the variation 3σ is 20 nm. In the case of the conventional method, the space between the nozzle and the wafer is set sufficiently wide for the developer liquid film applied onto the wafer not to be brought into contact with the nozzle and the wafer is stopped during development. In this case, the variation 3σ is 23 nm, which is shown in FIG. 5 as "disk nozzle noncontact development". As FIG. 5 shows, it turns out that the developer can be stirred and the uniformity of the pattern dimensions can be improved, by rotating the wafer at an appropriate velocity (10–50 rpm, preferably 30–40 rpm) during the development, while the developer film remains in contact with the lower surface of the nozzle.

The effect of this method on the uniformity improvement in resist pattern dimensions is not limited to the L&S pattern whose line and space width is 0.225 μm. It can also be achieved for any other patterns. This advantage is attained, regardless of types and sizes of patterns and can be seen in all patterns.

Results that may be obtained by using an ultrasonic oscillator will be described. A developer film is formed on the wafer by using the disk nozzle. Then, the ultrasonic oscillator applies ultrasonic waves to the wafer for 50 seconds, while a disk which has a bottom surface of the same shape as the wafer and which incorporates the ultrasonic oscillator remains in contact with the upper surface of the developer liquid film. The disk is withdrawn, and the wafer is rinsed and dried in the same manner as mentioned above. In this case, the variation 3σ is 30 nm. This value is greater than in the case where the wafer is rotated at a low velocity while the lower surface of the nozzle remains in contact with the developer liquid film. The value is greater also than in the case where the developer is supplied by the nozzle that does not contact the developer film while the wafer is not rotated during the development. Obviously, the uniformity of the wafer surface obtained after the development cannot be improved even if the ultrasonic oscillator is used. This is perhaps because the liquid agent is not always uniformly in contact with the surface of the substrate since voids are generated or destroyed in the liquid agent contacting the substrate, by the cavitation effect resulting from the vibration.

During the aforementioned development stirring, the wafer is rotated at a low speed and the disk nozzle in contact with the upper surface of the developer liquid film remains at a standstill. The stirring may be performed as will be explained with reference to FIG. 6, which is a partial sectional view of the development unit.

Figure 6:
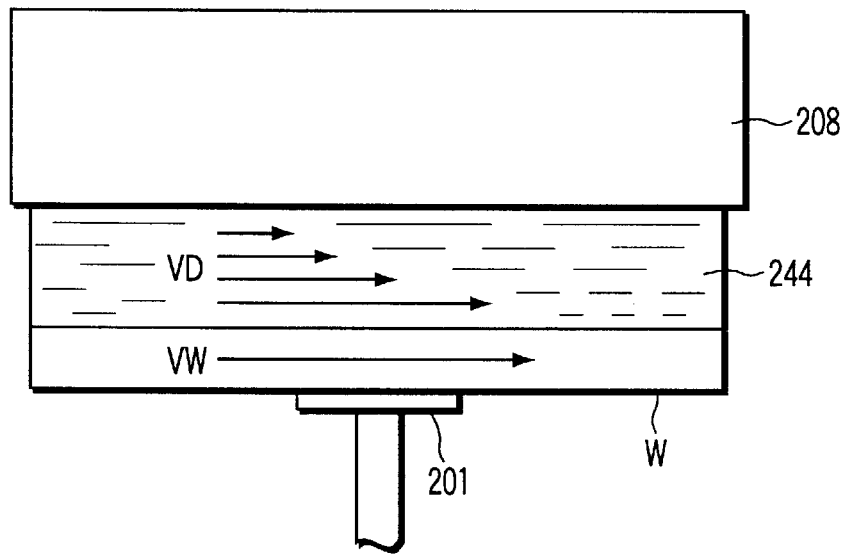
FIG. 6 is a schematic sectional view of the disk nozzle and the wafer for showing the relationship between the wafer rotation velocity (VW) and the rotation velocity (VD) of the developer.

If the upper surface of the developer does not contact the disk nozzle, the developer follows the rotational motion of the wafer. As a result, the developer is not stirred. In addition to that the developer flows outwardly due to centrifugal force, and the developer liquid film has no uniform thickness, therefore the uniformity in the pattern dimensions over the wafer decreases. If the upper surface of the developer liquid film 244 contacts the lower surface of the disk nozzle 208 as shown in FIG. 6, friction is generated between the developer liquid film 244 and the lower surface of the disk nozzle 208. The friction between the developer liquid film 244 and the lower surface of the disk nozzle 208 prevents the developer liquid film 244 from moving together with the wafer W. Consequently, the rotational velocity of the developer liquid film 244 is lower than that of the wafer W. The liquid film 244 therefore moves relative to the wafer W. This prevents the local accumulation of the reaction products and local consumption of the starting liquid agent in the developer liquid film 244 that contacts the wafer W, which can happen depending upon the photosensitive pattern.

Furthermore, the rotational velocity VD of the developer liquid film 244 near the wafer W is higher than the rotational velocity VD near the disk nozzle 208, because the wafer W has the rotational velocity VW and the nozzle 208 remains at a standstill. Consequently, the moving rate of the developer at the upper portion of the developer film differs from that at the lower portion of the developer film, as is illustrated in FIG. 6. Thus, it is presumed that stirring effect within the developer film has also developed.

In the present invention, the liquid agent is stirred by moving the upper and lower surfaces of the liquid agent film at different speeds. It is therefore possible to move the liquid agent over a large area. If an ultrasonic oscillator is used, the liquid agent is slightly stirred, and the movement of the liquid agent is limited to a small area. With the method of the present invention it is possible to stir the liquid agent in a large area. The method can therefore effectively render the concentrations of the starting liquid agent and reaction products uniform. The spilling of the developer 244 due to the centrifugal force and non-uniformity in the thickness of the liquid film can be prevented by the friction between the disk nozzle 208 and the developer film 244, by contact of the disk nozzle with the liquid film with rotating the wafer W at an appropriate velocity. Hence, a developed wafer having uniform dimensions can be obtained.

In the aforementioned explanation, the wafer is rotated in a plane parallel to the wafer surface. If the wafer is moved relative to the liquid agent holding member (developer supply nozzle or disk nozzle), the same advantages as mentioned above can be obtained. Therefore, the wafer may be maintained at a standstill, whereas the developer holding member is moved. Alternatively, both the holding member and the wafer may be moved in the same direction or in the opposite directions.

The wafer is rinsed by using a straight-tube rinse nozzle in the aforementioned embodiment. Instead, a disk nozzle may be used to rinse the wafer. Especially, in the case that the liquid agent supply nozzle acts also as the liquid agent holding member, it is effective. The nozzle surface can also be washed during the step of rinsing the wafer if the rinse solution is supplied from the same nozzle to the wafer, and the rinse solution contacts the nozzle for a certain time. The step to separate the nozzle from the liquid agent is needed to remove the rinse solution from the space between the nozzle and the wafer.

Embodiment 2

Embodiment 2 of the invention will be explained with reference to FIGS. 7 and 8.

Figure 7:
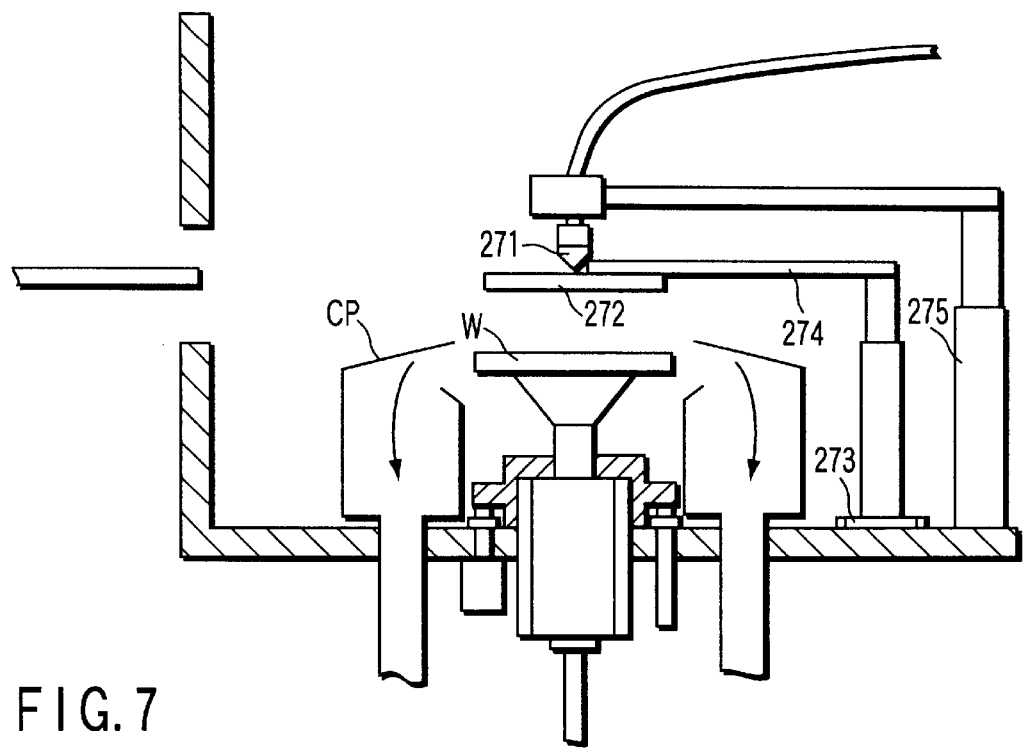
FIG. 7 is a schematic sectional view of the development unit according to Embodiment 2 of the present invention.
Figure 8:
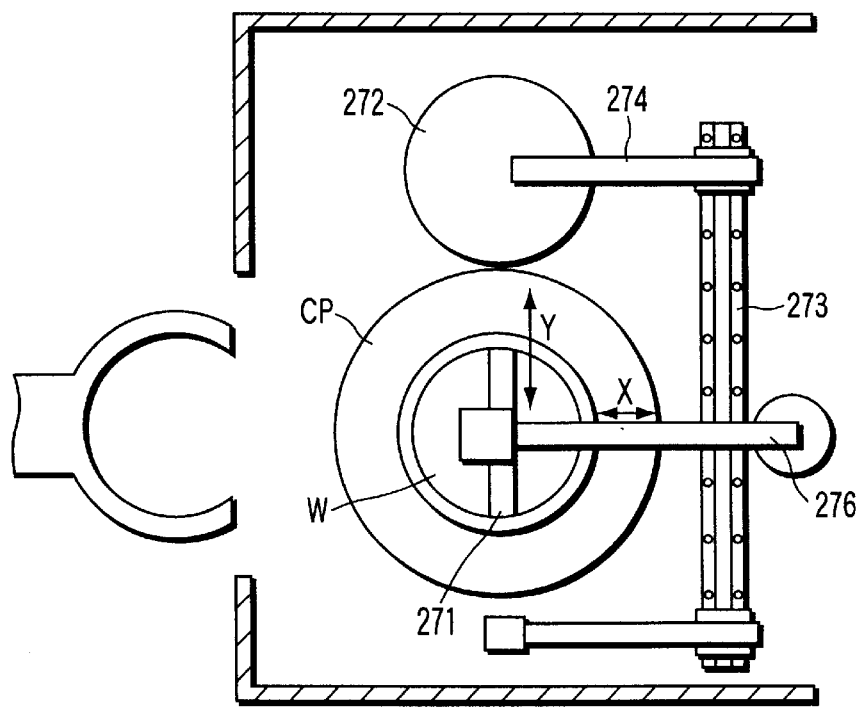
FIG. 8 is a schematic plan view of the development unit according to Embodiment 2.

FIGS. 7 and 8 are sectional and plan views of an entire structure of a development unit, respectively. The developing unit has a linear nozzle 271, which has a linear developer supply section whose length is almost the same as a diameter of the wafer. A developer holding member 272 is attached to the unit in addition to the developer supply nozzle 271. The member 272 faces the wafer W, and can be used to sandwich the developer between the member and the wafer. The developer holding member (stirring member) 272 is attached to the distal end of a holding member scan arm 274. The arm 274 is a drive mechanism that can move on a guide rail 273 in the Y direction. The developer holding member 272 moves between a stand-by position and a position where it faces the wafer W.

The developer supply nozzle 271 is attached to the nozzle scan arm which is secured to a supporting shaft 275, which is fixed at a position different from the guide rail 273. The developer supply nozzle 271 moves toward or away from a position near the wafer W when the nozzle scan arm is moved upwards or downwards. Alternatively, the supporting shaft supporting the nozzle scan arm may be mounted on another guide rail which is provided at some distance from the guide rail 273 and may move on another guide rail.

Figure 9A:
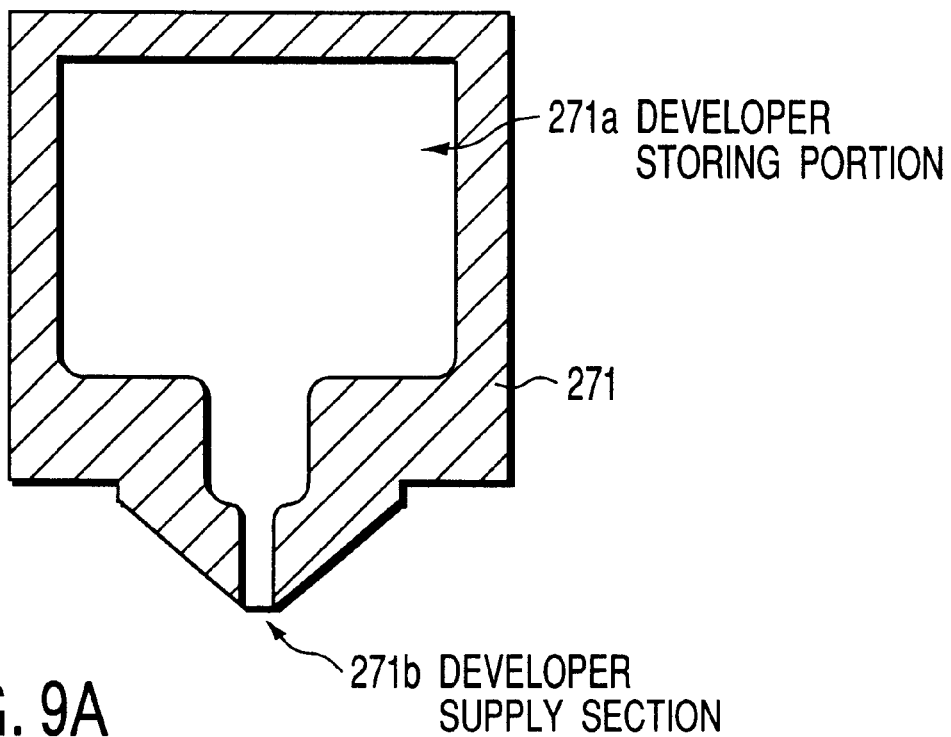
FIGS. 9A and 9B are a cross sectional view and a bottom view, respectively, of the linear nozzle according to Embodiment 2 for explaining the structure thereof.
Figure 9B:
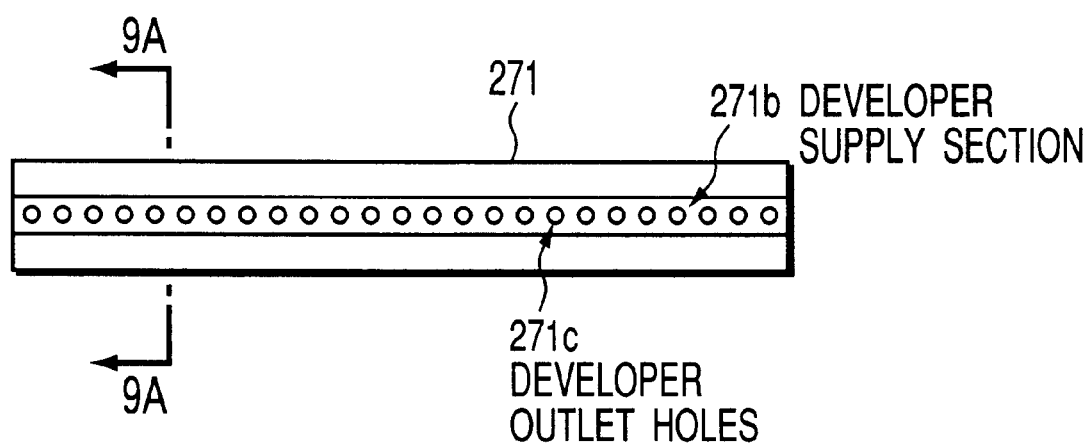

The linear nozzle has at least a developer storing portion and a linear developer supply section. The developer storing portion stores the developer supplied by developer supply tubes. The developer supply section has almost the same length as a diameter of the wafer. FIGS. 9A and 9B show one example of the linear nozzle, which are used in this embodiment. There is a developer-storing portion like a box container inside the nozzle. The center portion of the bottom protrudes as shown in FIG. 9A. There is the developer supply section at the protruded portion. The developer supply section is made of small holes (developer outlet holes) arranged in a line. The diameter of the holes is 0.4 mm and the interval between the adjacent two holes is 2 mm. The developer supply section has almost the same length as the diameter of the wafer. The length of the developer supply section is not needed to be longer than the diameter of the wafer, because the developer spreads after discharge from the nozzle holes. The width of the nozzle is approximately 35 mm. After the developer is stored in the developer storing portion, the developer is supplied on the wafer as it seeps through the small holes (developer outlet holes) on the bottom of the nozzle.

After post-exposure baking has been performed in the same way as in Embodiment 1, the wafer W is moved into the development unit and held immovable by the spin chuck.

Figure 10A:
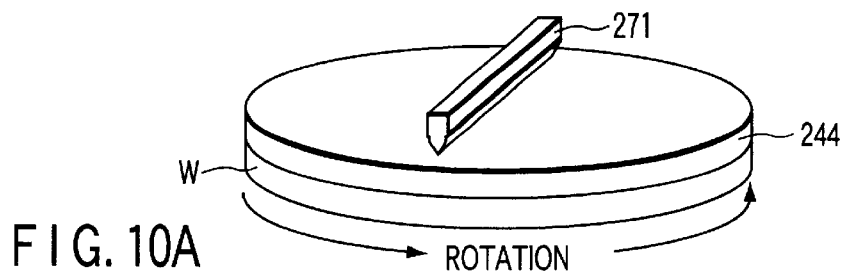
FIGS. 10A and 10B are perspective views sequentially showing the developer coating method according to Embodiment 2.

The nozzle 271 first moves downwards as the arm 276 moves down. The protruding portion of the nozzle bottom is spaced apart from the wafer by a distance of 2 mm. While the wafer is being rotated at 1000 rpm for 2 seconds, the developer is applied from the nozzle and spread over the surface of the wafer W. Then, the developer is supplied to the wafer while the wafer W is being rotated at 30 rpm for 2 seconds, forming a developer liquid film on the wafer W as shown in FIG. 10A. The linear nozzle 271 is lifted as the arm 276 moves upwards.

Figure 10B:
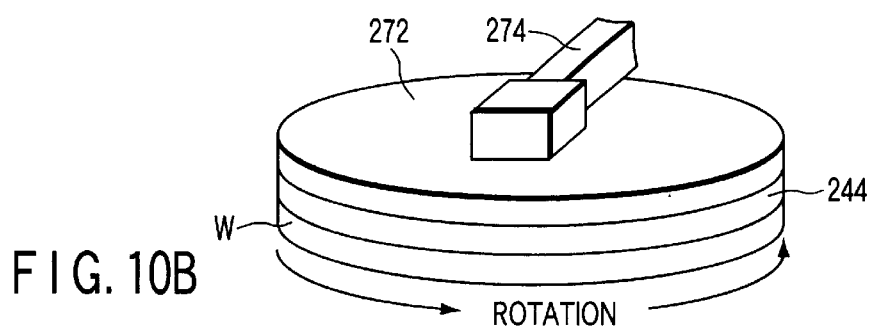

The developer holding member 272 is moved to face the wafer as the scan arm 274 moves along the guide rail 273. The member 272 is then moved down until it contacts the developer. The development is performed for 45 seconds, while the wafer is being rotated at 30 rpm as shown in FIG. 10B. The development time of 45 seconds has been determined so that a period of 60 seconds passes from the start of applying the developer to the start of applying the rinse solution. This period includes the time (5 seconds) for moving the nozzle and the developer holding member and the time (6 seconds) for moving the developer holding member and the rinse nozzle. The development time may be changed in accordance with the development conditions.

The developer is held by the developer holding member 272 between the wafer and the developer holding member 7, instead of the development nozzle 208 shown in FIG. 4B. The same advantages can be obtained as in Embodiment 1.

Thereafter, a rinse solution is supplied with the wafer rotated at 2000 rpm, whereby the developer is removed from the wafer W, and the development is thus terminated. The wafer W is washed with a rinse solution while the wafer is being rotated at 500 rpm. Finally, the supply of the rinse solution is stopped, and the wafer W is rotated at 2000 rpm, whereby the rinse solution is removed from the wafer W, and the wafer W is dried.

In this case, the line width (dimension) variation (3σ) over a wafer was 8 nm for an L&S pattern whose line width and space width is 0.225 µm, as in the first embodiment. Obviously, if the developer liquid film contacts the developer holding member and if the wafer is rotated at an appropriate rotation number, the developer can be stirred to improve the pattern dimension uniformity.

Preferably, the developer holding member has the same shape as the wafer W. Nonetheless, the developer holding member may have a different shape.

Figures 11A, 11B:
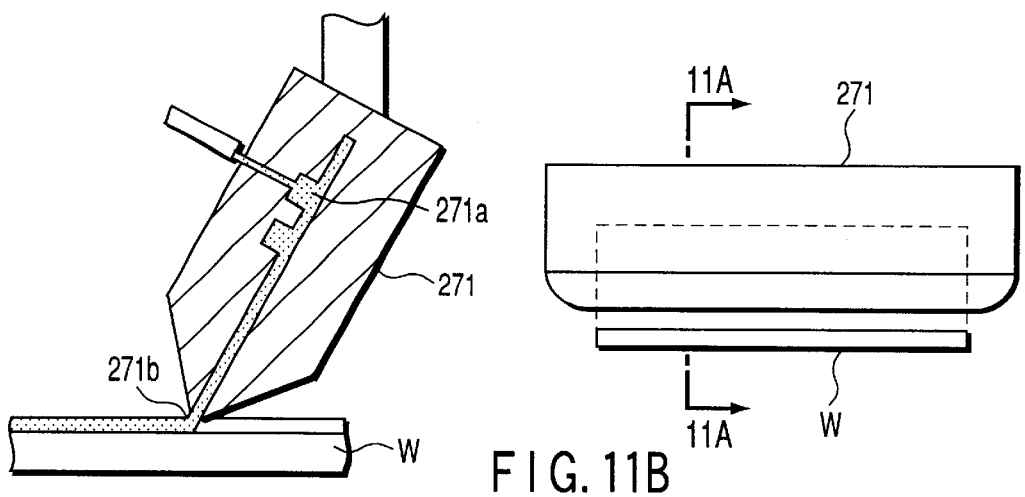
FIGS. 11A and 11B are a cross sectional view and a front view, respectively, of another example of the nozzle according to Embodiment 2, whose developer supply section is a slit.
Figures 11C, 11D, 11E:
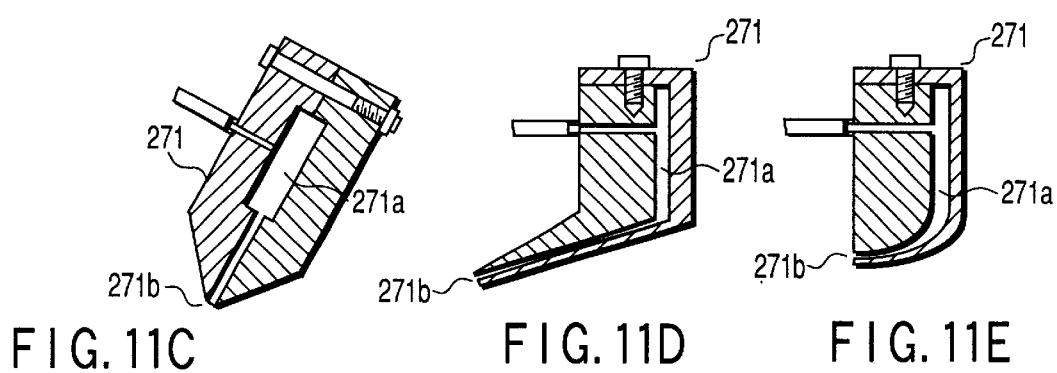
FIGS. 11C–11G are cross sectional views showing modified examples of FIG. 11A, which supply the developer not only in the downward direction but also in the opposite direction to the nozzle moving direction.
Figures 11F, 11G:
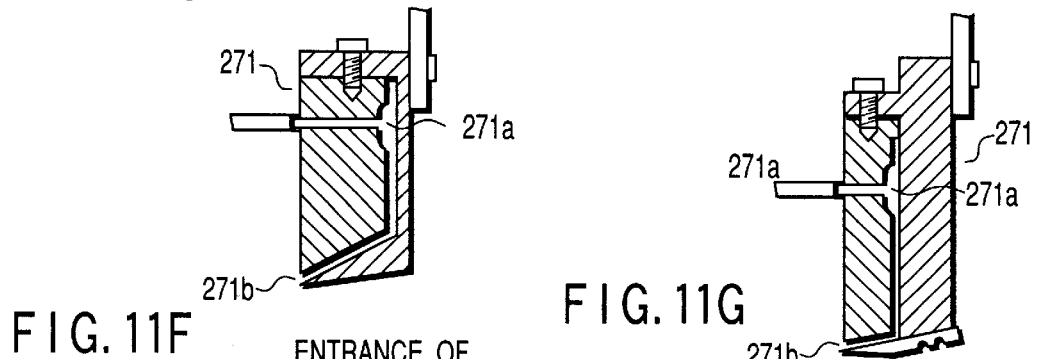
Figure 11H:
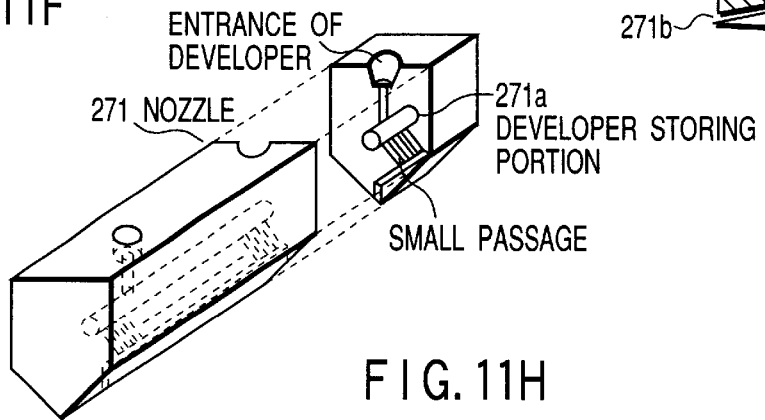
FIG. 11H is a perspective view of a nozzle having a plurality of small passages between a developer storing portion and a slit, as a still another example of Embodiment 2.

Further, the linear developer nozzle 271 having a number of small holes may be replaced by other types of linear nozzle. The developer supply section may be made of a narrow slit or made of plural openings like ellipses or slits. For example, FIGS. 11A and 11B show a developer supply section having a narrow slit. Otherwise, a nozzle supplying the developer in the opposite and downward direction of the nozzle movement, in stead of supplying the developer downwards just below the nozzle, may be used, as shown in FIGS. 11C–11G. In addition to those, a nozzle that has small passages between the developer storing portion and the developer supply section may be used, as shown in FIG. 11H. The role of the small passages is to make the pressure of the developer uniform. Alternatively, a disk nozzle or parallel nozzles may be used to apply the developer to the wafer W. Furthermore, any other types of developer supply nozzles may be employed.

As indicated above, the developer is applied to the rotating wafer W from the nozzle 271 that has been immobilized. Instead, the developer may be applied onto the immobilized wafer from a linear nozzle whose developer supply section has the same length as the wafer diameter, while the nozzle being moved over the wafer, in one direction parallel to the wafer W from one side to the other.

The stand-by position for the developer holding member may be set above the wafer W, not at one side of the wafer as described above.

In Embodiment 1, the developer is supplied from the disk nozzle and then stirred by the disc nozzle. In Embodiment 2, the developer is supplied from the linear nozzle and stirred by the developer holding member. The present invention is not limited to these embodiments. The nozzle which has such a shape as to hold the developer can be used not only to apply the developer but also to stir the developer. A modified embodiment, which has a linear nozzle, will be explained below.

Figure 12:
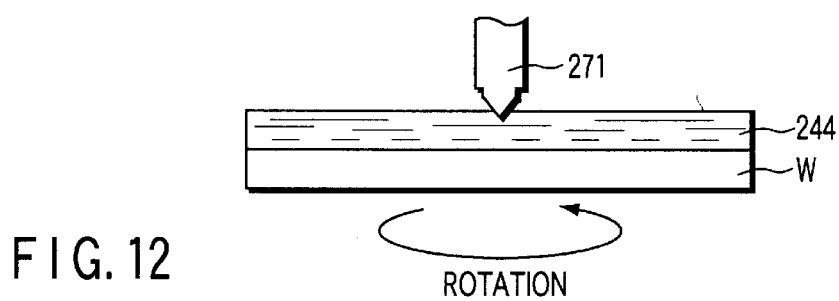
FIG. 12 is a cross sectional view of a linear nozzle and a wafer according to a modified example of Embodiment 2, for explaining a method how to stir the developer by the linear nozzle.

The nozzle 271 used in the modified embodiment is similar to the nozzle incorporated in Embodiment 2, but has its lower edge located at a distance of 0.5 mm from the upper surface of the wafer W. The lower end of the nozzle 271 can therefore contact the developer applied to the wafer W. After the developer is supplied onto the wafer in the same manner as in Embodiment 1, the wafer is continuously rotated at 30 rpm. The wafer is developed for 50 seconds while being rotated as mentioned above. The development time of 50 seconds has been determined so that a period of 60 second may pass from the start of application of the developer to the start of application of the rinse solution. The 60-second period includes the time of 4 seconds for applying the developer and the time of 6 seconds for moving the nozzle and the rinse nozzle. Thus, the developer is held between the nozzle bottom and the wafer as shown in FIG. 12. The same advantages can be obtained as in Embodiment 1.

Embodiment 3

Embodiment 3 will be explained with reference to FIGS. 13A and 13B.

Figure 13A:
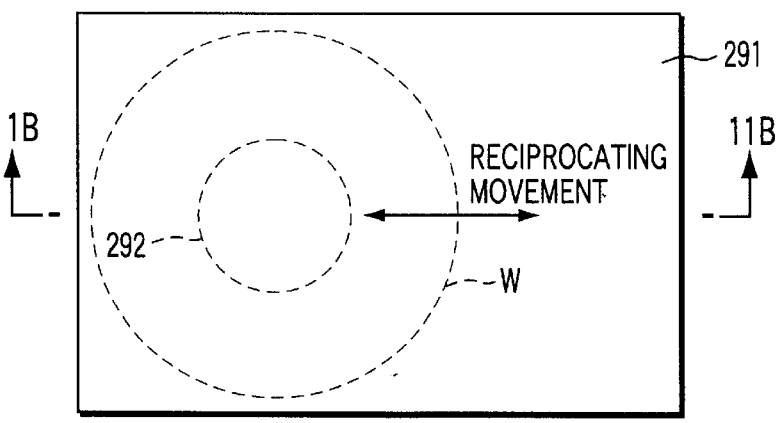
FIG. 13A is a schematic plan view of the liquid agent holding member of a development unit according to Embodiment 3 of the present invention.
Figure 13B:
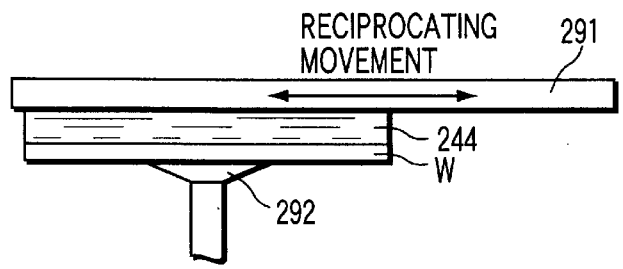
FIG. 13B is a cross sectional view taken along the line 11B—11B of the FIG. 11A.

As shown in FIGS. 13A and 13B, the developer applied to the wafer W can be effectively stirred by moving the developer holding member 291 in parallel to the wafer surface. For example, a guide rail is provided in the same manner as shown in FIGS. 7 and 8. The developer holding member 291 is secured to a drive mechanism, which can freely move on the guide rail, enabling the holding member to move between a stand-by position and a position where the holding member faces the wafer. The holding member must be moved repeatedly at high speed during the development process. Therefore, a motor drives the holding member to move at a sufficiently high speed.

In FIGS. 13A and 13B, a developer holding board is provided which is larger than the wafer is used to stir the developer. The holding board may be replaced by a holding board smaller than the wafer.

Embodiments 1 to 3 show the case that at least one element of the wafer and the developer holding member is rotated or reciprocated in parallel to the main surface of the substrate. Of course, one of the wafer and the developer holding member may be rotated and the other may be reciprocated in parallel to the main surface of the substrate.

Embodiment 4

Embodiment 4 of the present invention will be described with reference to FIGS. 14 to 19.

Figure 14:
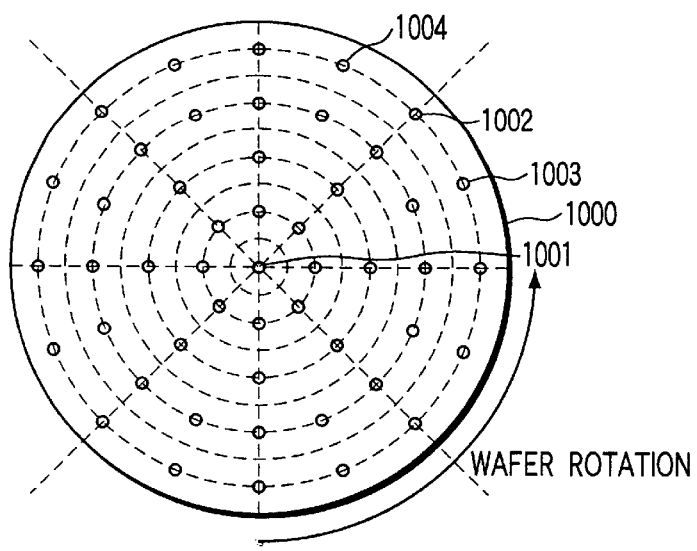
FIG. 14 is a plan view of a conventional disk nozzle, for showing the position of an outlet hole.
Figure 15:
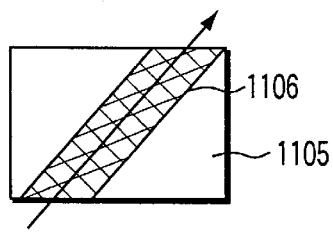
FIG. 15 is a partial plan view of a substrate for showing a developing region of the substrate in the case where the disk nozzle of FIG. 14 is used.
Figure 16:
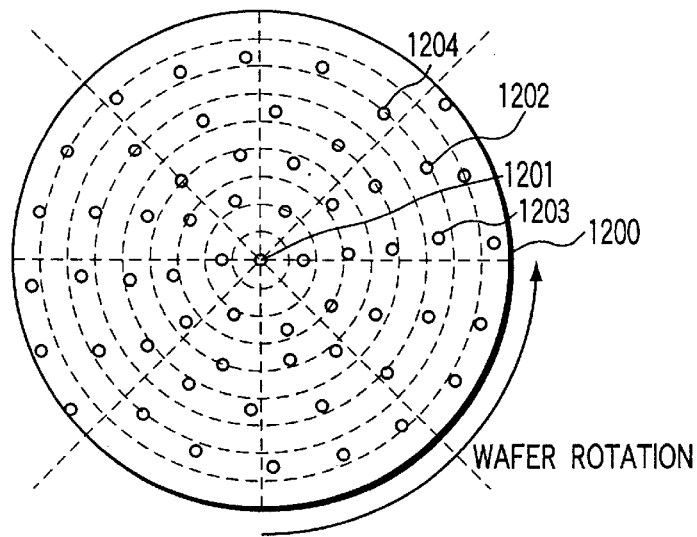
FIG. 16 is a plan view of a disk nozzle according to Embodiment 4 of the present invention, for showing the position of the disk nozzle.
Figure 17:
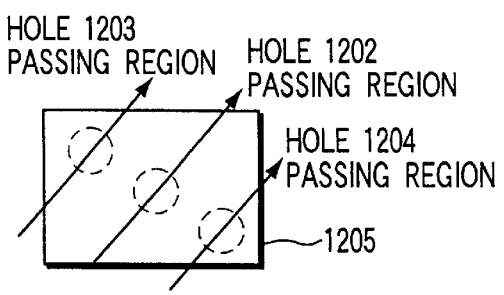
FIG. 17 is a partial plan view of the substrate for showing a developing region of the substrate in the case where the disk nozzle of FIG. 16 is used.
Figure 18:
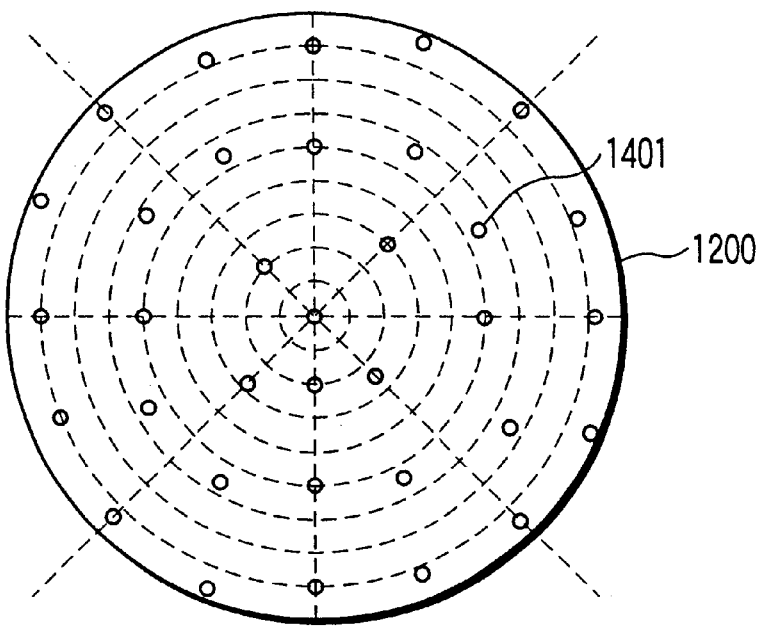
FIG. 18 is a plan view of a modified example of the disk nozzle according to Embodiment 4.
Figure 19:
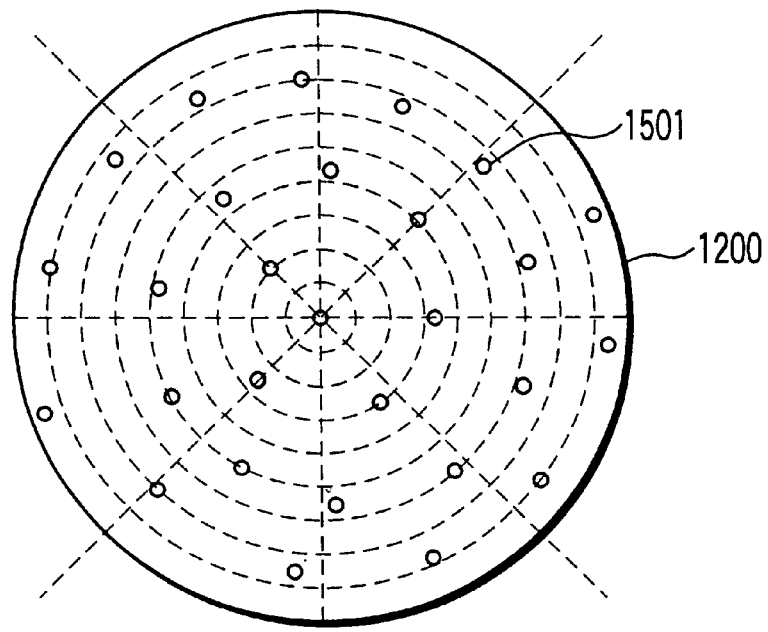
FIG. 19 is a plan view of another modified example of the disk nozzle according to Embodiment 4.

FIG. 14 is a plan view of a conventional disk nozzle (developer supply nozzle) 1000 which has outlet holes. FIG. 15 a partial plan view of the development region 1105 of a wafer, over which an outlet hole shown in FIG. 14 passes. FIG. 16 is a plan view of a disk nozzle 1200 according to Embodiment 4, which has outlet holes. The disk nozzle 1200 corresponds to the portion 208 in Embodiment 1. FIG. 17 is a partial plan view of the development region 1205 of the wafer, over which the outlet holes shown in FIG. 16 passes. FIGS. 18 and 19 show two modifications of the disk nozzle 1200, which differ in the arrangement of the outlet holes. In FIGS. 14, 16, 18, and 19, the broken circles facilitate the arrangement of the outlet holes.

As shown in FIG. 14, the conventional disk nozzle 1000 has a plurality of outlet holes 1002, 1003, 1004 . . . . The outlet holes are arranged in concentric circles. If the developer is applied to a wafer by the conventional disk nozzle 1000, however, the wafer will fail to have uniform pattern dimensions over the wafer. This is because the developer present in each outlet hole and the developer existing at the upstream of the outlet hole will diffuse into each other, especially at that portion of the wafer which is located right below the outlet hole. The developer applied at this portion is fresher than the developer applied to the other portions of the wafer. As a consequence, the wafer is developed faster at the portions right below the outlet holes than at the other portions.

Even if the wafer is rotated around the nozzle 1001, outlet holes 1002, 1003, 1004 . . . pass over a limited region 1106 of the wafer 1105. The wafer 1105 is inevitably developed at high rate at this limited region as shown in FIG. 15. Therefore, the improvement of the uniformity in film thickness cannot be attained.

On the other hand, the outlet holes of the disk nozzle 1200 according to the present invention are arranged as shown in FIG. 16. In FIG. 16, the outlet holes 1202, 1203, and 1204 are arranged such that they do not pass in a limited region while the wafer is being rotated (during the stirring process). When the disk nozzle 1200 is used, a region through which the outlet hole 1202 passes shifts from those regions through which the outlet holes 1203 and 1204 passes as shown in FIG. 17.

In addition, the outlet holes pass through the region 1202 to 1204 far less frequently than the holes of the conventional disk nozzle 1000 (FIG. 14). Hence, the disk nozzle 1200 serves to improve drastically the pattern dimension uniformity over the wafer. When the developer is applied from the outlet holes, the wafer receives pressure at the portions located immediately below the outlet holes, which impair the pattern dimension uniformity. To prevent this, the pressure below the outlet holes should be as small as possible. The total amount of the developer supplied onto the wafer is predetermined. So it is desirable that the amount of supplied developer per hole is less and the number of the holes is more when the developer is supplied in the predetermined time.

In Embodiment 4, the disk nozzle 1200 serves also as a developer holding member. Nonetheless, a developer holding member may be provided, besides the disk nozzle 1200. If so, the pH value the developer has at a position right below an outlet hole differs from the pH value the developer has at any position far from the outlet hole. To improve the dimension uniformity of the pattern formed on the wafer, the output holes should be arranged as shown in FIG. 16, more preferably as shown in FIGS. 18 and 19. Furthermore, it is desirable that the outlet holes is distributed uniformly over the entire disk nozzle 1200.

In Embodiment 4, a developer film is formed by applying the developer from the entire lower surface of the disk nozzle 1200, while the wafer is rotated at low speed. However, the method of forming a film is not limited to this. A mechanism for suppressing foams (cause of defects) which are generated in the developer after the developer is applied to the wafer, and a mechanism for supplying a developer to the entire wafer at the almost same time may be used as in Embodiments 5, 6 and 7, which will be described below.

Embodiment 5

Embodiment 5 will be explained with reference to FIGS. 20 and 21.

Figure 20:
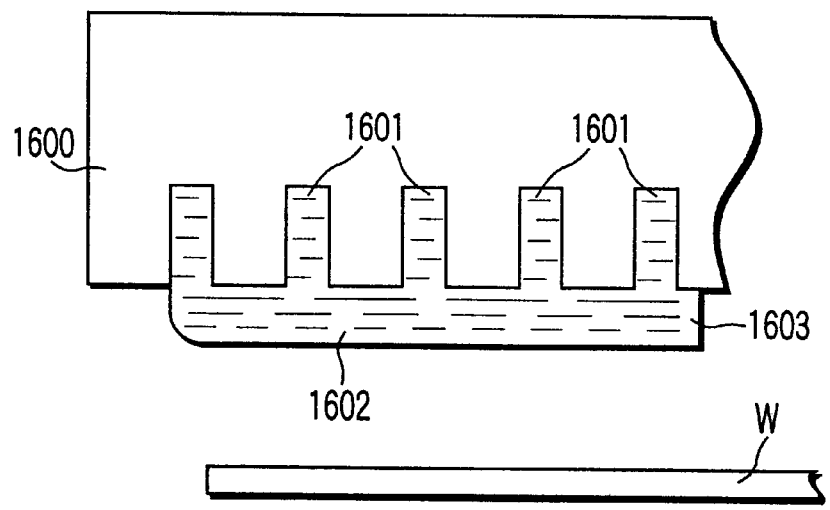
FIG. 20 is a partial cross-sectional view of a disk nozzle according to Embodiment 5, for explaining a development method in which development is initiated by bringing a developer film, which is formed by the use of surface tension of the developer, to be contact with the wafer.
Figure 21:
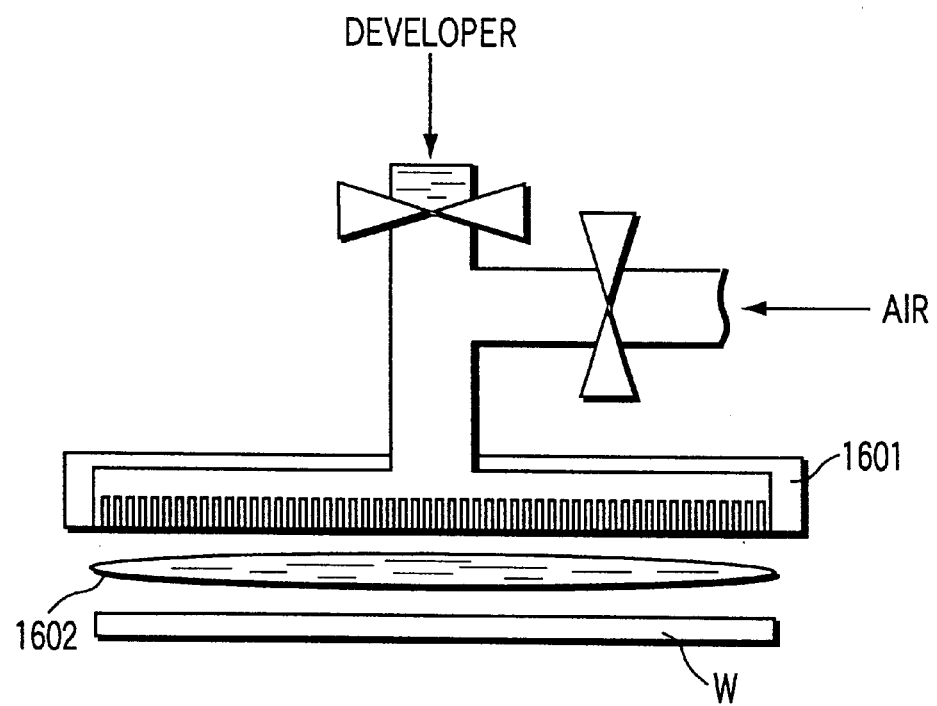
FIG. 21 is a cross-sectional view of the disk nozzle including peripheral structural elements, explaining that development is initiated in Embodiment 5 by dropping, onto a wafer surface, the developer film formed by virtue of the surface tension.

FIG. 20 is a sectional view of a disk nozzle, explaining that a developing process is initiated by bringing a developer film (formed by virtue of the assistance of surface tension) into contact with a wafer. To develop a resist film provided on the surface of a substrate such as a wafer, the developer film is formed on the surface of the disk nozzle by virtue of the surface tension. Then, the developer film is made in contact with the wafer, thereby initiating the development. The developer is applied to the entire surface of the wafer at a time. Air may remain in a space between the surface of the developer liquid film and the surface of the resist, but no fine foams are generated on the wafer surface. The foams generated at this time are large enough to rise to the upper surface of the developer liquid film. The developer liquid film, therefore, has no defects.

In the development unit, the developer may be slightly forced from the nozzle holes 1601 by the pressure applied before the start of the development process. If so, adjacent developer droplets from adjacent nozzle holes 1601 combine together due to the surface tension, forming a developer film 1602 on the nozzle surface (FIG. 20).

Subsequently, the wafer having a latent image formed on its surface is lifted, together with a wafer holder (not shown), until it contacts the developer liquid film 1602. The development is thereby initiated. In this process, the developer is applied to the entire region of the wafer, which is to be processed in a moment. Then the developer is supplied through the nozzle holes as the distance between the wafer and the nozzle is widened with the contact between the developer and the nozzle. At last, the desired amount of the developer is discharged on the wafer and the distance is set at the predetermined distance.

After the developer has been applied to it, the wafer is moved relative to the disk nozzle holding the developer, as in Embodiments 1 to 4. Upon lapse of 60 seconds from the start of the development, the disk nozzle is moved up, and rinse solution is applied to the wafer, terminating the development. After rinsed thoroughly, the wafer is rotated at high speed, whereby the rinse solution is removed from the wafer. Post-baking is performed on the wafer at 130° C. for 90 seconds. The wafer is taken from the developing unit.

In the above explanation, the wafer is moved up to contact the developer film. Nevertheless, the development may be initiated by dropping the developer liquid film onto the wafer, as shown in FIG. 21, by supplying air through the holes of the disk nozzle connected to an air supply system, after the developer liquid film has been formed.

In the above development process, the nozzle is moved to a predetermined distance, while the disk nozzle remains in contact with the developer and while the developer is applied to the wafer from the developer supply system through the nozzle holes, after the wafer has come in contact with the developer film. Instead, after the wafer has come in contact with the developer film, the distance between the wafer and the nozzle may be set at the predetermined distance and then the space may be filled with the developer.

Embodiment 6

Embodiment 6 will be explained with reference to FIGS. 22A to 22C.

Figure 22A:
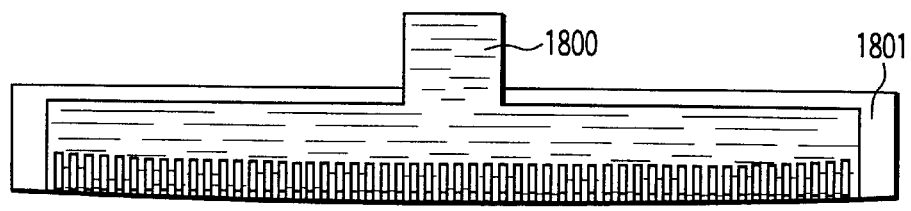
FIGS. 22A–22C are sequential cross sectional views of the disk nozzle according to Embodiment 6, explaining how to prevent foam generation when the developer film is formed by a disk nozzle having a slightly protruding center.
Figure 22B:
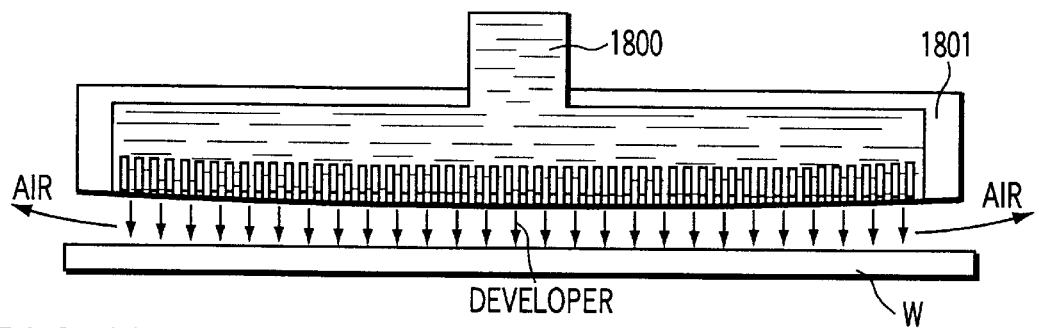
Figure 22C:
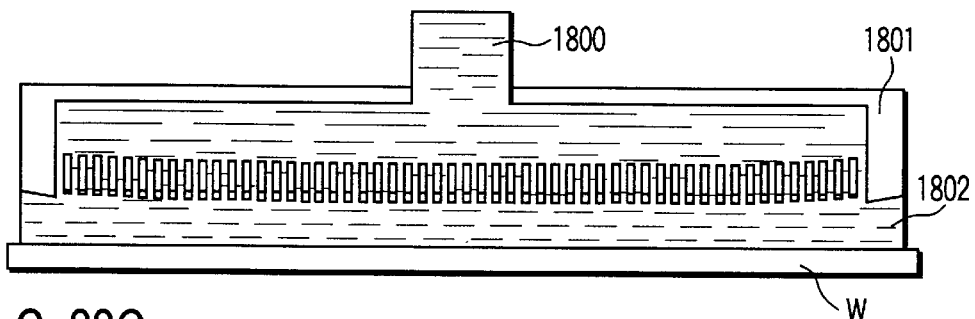

FIGS. 22A to 22C are sectional views of a disk nozzle having a center portion slightly protruding. A method of developing wafer by using this disk nozzle will be explained.

To prevent generation of foams during the process of forming a developer film, it is effective to employ a disk nozzle having a center portion that protrudes slightly. Air is forced out from the developer, thereby preventing foams from being made when the developer is mounted on the wafer.

The wafer having a latent image formed on it is transported into the development unit. A disk nozzle 1801 is used, which is circular as viewed from the bottom. The center part of the disk nozzle 1801 slightly protrudes, as shown in FIG. 22A.

The disk nozzle 1801 is spaced from the wafer by a distance of 2 mm. Developer 1800 is applied onto the wafer as shown in FIG. 22B. At the same time, the wafer is rotated at 60 rpm, whereby the developer spreads itself over the entire surface of the wafer. The developer 1802 is applied until it contacts the disk nozzle 1801, forming a film 1802 as is illustrated in FIG. 22C.

During the development step, the wafer of the present invention is moved relatively to the disk nozzle holding the developer in the same manner as explained in Embodiments 1 to 4. Upon lapse of 60 seconds from the start of the development, the disk nozzle 1801 is moved up, and rinse solution is applied to the wafer, thereby terminating the development process. After being thoroughly rinsed, the wafer is rotated at high speed, whereby the rinse solution is removed from the wafer. The post-baking is performed on the wafer at 130° C. for 90 seconds. The wafer is taken from the development unit.

Since the surface of the disk nozzle is curved, a space is provided in the wafer peripheral region between the nozzle surface and the wafer surface. Air is forced out through this space. No foams are generated. Therefore, the number of defects is reduced after completion of the development.

As described above, the developer is supplied from the nozzle holes, directly to the wafer. Instead, the developer liquid film formed on the surface of the nozzle may be set into contact with the wafer to initiate the development, as in Embodiment 5. Alternatively, the developer liquid film may be dropped onto the wafer to start the development, by supplying air from an air supply system.

Moreover, the same effect may be expected as the above embodiment, if the substrate surface facing the nozzle is in a convex form during the developer supply.

Embodiment 7

Embodiment 7 will be described with reference to FIG. 23.

Figure 23:
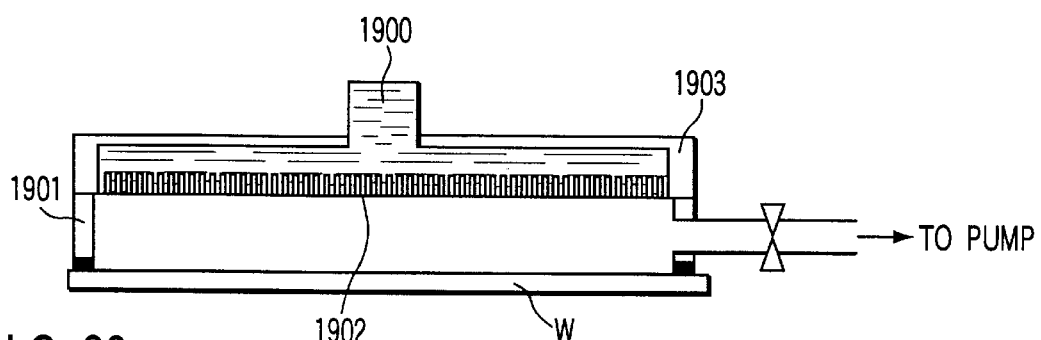
FIG. 23 is a cross-sectional view of the disk nozzle of the development unit according to Embodiment 7, explaining how to mount the developer by evacuating a space between the disk nozzle and the wafer by means of a liquid and air pump.

FIG. 23 is a sectional view of a disk nozzle, explaining a method of applying developer to the wafer by creating a low vacuum between the disk nozzle and the wafer by use of a liquid/gas evacuating pump.

As the way to prevent generation of foams when the developer is applied, the apparatus provides a cover (wall) between the wafer and the periphery of the disk nozzle, thereby providing a space and to connect this space to the liquid/gas evacuating pump. When the space is evacuated by a liquid/gas pump, generating a vacuum, the developer is pushed out of the nozzle holes and the developer is applied from the disk nozzle onto the wafer. The developer is thereby applied to the entire surface of the wafer almost at a time. Since air is removed as mentioned above, virtually no foams are generated in the developer film formed on the wafer.

A cover 1901 having a height of 2 mm is provided under the disk nozzle 1903 and on the wafer. The cover 1901 and the disk nozzle therefore shields, like a cap, the main surface of the wafer. A part of the cover 1901 is connected with the liquid/gas pump. Air is drawn from the space provided between the disk nozzle 1903 and the cover 1901 by the evacuation of the space with the liquid/gas pump. At the same time, the developer 1900 is forced out from the disk nozzle 1903 through the nozzle holes 1902. The developer 1900 is thereby applied to the wafer. When the developer 1900 is supplied to a desired amount into the space between the wafer and the disk nozzle 1903, the liquid/gas pump is stopped. Then, in order to move the wafer relatively to the cover and the disk nozzle, the liquid/gas pump is run reversely.

The wafer W of the present invention is moved relative to the disk nozzle holding the developer, as in Embodiments 1 to 4. Upon lapse of 60 seconds from the start of the application of developer, the disk nozzle 1903 is moved up. A rinse solution is then applied to the wafer, thereby terminating the development. After thoroughly rinsed, the wafer W is dried while spinning. Post-baking is performed on the wafer W at 130° C. for 90 seconds. Then, the wafer W is taken from the development unit.

To lift the cover and the disk nozzle, the liquid/gas pump is operated reversely in the aforementioned example. Alternatively, the liquid/gas pump may be stopped after the developer has been applied in a desired amount, and additional developer or air is applied through the nozzle holes, thereby to lift the cover and the disk nozzle.

In the embodiments described above, the developer liquid film is formed directly on the wafer. A liquid film such as a water film, which cannot develop the film, may be formed before the formation of the developer liquid film. The developer liquid film may then be formed, while the liquid film (water film) is being removed from the wafer. Thus, the dimension uniformity of the formed pattern can be well improved, and defects can be reduced.

As described above, the substrate processed in the aforementioned embodiments is a semiconductor wafer. Nonetheless, the method and apparatus of the present invention can be applied to other substrates, such as a liquid crystal display substrate and an exposure mask substrate.

The development process carried out in the embodiments described above is designed to form a photosensitive resin pattern. However, the main feature of the invention resides in bringing the liquid agent holding member into contact with part of the liquid agent and by moving the holding member or the substrate during the wet process. The starting reaction materials and the reaction products in the liquid agent therefore have uniform concentrations in the region where they contact the substrate surface. So the dimension uniformity of the pattern formed on the wafer is improved. Accordingly, the present invention can be applied to a wet etching process and an apparatus for manufacturing a chromium exposure mask.

The stirring method of the invention not only renders the concentration of the liquid agent uniform all over the substrate surface, but also reduces the concentration of the reaction products accumulated on the substrate surface and increases the concentration of the starting materials of the liquid agent. Therefore, the processing rate can be also increased.

As has been described, the method of the present invention can be used to remove organic materials from a substrate, remove a photoresist pattern after etching, and remove a native oxide film from a silicon wafer. The present invention can be applied to Au plating of a substrate if an electrode is provided on the substrate and the liquid agent holding member and if a plating solution is used in place of the liquid agent.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method comprising:
    a first step of supplying a liquid agent onto a main surface of a substrate;
    a second step of bringing an upper surface of a film of the liquid agent in contact with a liquid agent holding member which faces the substrate in order to hold the liquid agent between the substrate and the liquid agent holding member; and
    a third step of moving at least one element of the substrate and the liquid agent holding member in parallel to the main surface of the substrate causing relative movement along a direction parallel to the main surface of the substrate and between the substrate and the liquid agent holding member, while holding the liquid agent in contact with the liquid agent holding member which faces the substrate, in order to treat uniformly the main surface of the substrate with the liquid agent.

2. The substrate processing method according to claim 1, wherein the second step includes a step of using a liquid agent supply nozzle as the liquid agent holding member.

3. The substrate processing method according to claim 1, wherein the first step includes a step of applying the liquid agent, by use of a disc nozzle with plural liquid agent outlet holes or by use of a linear nozzle which has a linear developer supply section whose length is almost the same as a diameter of the wafer, while rotating the substrate or moving the linear nozzle from one end of the substrate to the other in parallel to the main surface of the substrate which is at a sandstill.

4. The substrate processing method according to claim 1, wherein the second step includes a step of moving the liquid agent holding member so as to face the substrate and bringing the liquid agent holding member in contact with an upper surface of the film of the liquid agent.

5. The substrate processing method according to claim 1, wherein the third step includes a step of performing reciprocating movement or rotational movement.

6. The substrate processing method according to claim 5, wherein the rotational movement includes rotating the substrate while the liquid agent holding member is immobilized.

7. The substrate processing method according to claim 1, wherein the velocity of the rotational movement is 10 to 50 rpm.

8. The substrate processing method according to claim 1, wherein the first step includes a step of forming a single liquid-agent film on a surface of the liquid agent supply nozzle facing the substrate, supplying the liquid agent to the main surface of the substrate in the form of film, and using the liquid agent supply nozzle as the liquid agent holding member.

9. The substrate processing method according to claim 8, wherein the first step includes a step of supplying the liquid agent to an entire surface of the substrate almost simultaneously.

10. The substrate processing method according to claim 8, wherein the first step includes a step of supplying the liquid agent onto the main surface of the substrate while a substrate surface facing the liquid agent supply nozzle remains in a convex form.

11. The substrate processing method according to claim 3, wherein the first step includes a step of supplying the liquid agent by using the liquid agent supply nozzle having the surface made in a convex form.

12. The substrate processing method according to claim 1, wherein the first step includes a step of supplying the liquid agent while reducing pressure in a space provided between the substrate and the liquid agent supply nozzle.

13. The substrate processing method according to claim 1, wherein the liquid agent is one selected from the group consisting of a developer, an etching solution, a washing solution, a remover agent, a film formation solution and a plating liquid.

14. The substrate processing method according to claim 1, further comprising a step of rinsing the liquid agent holding member simultaneously with the main surface of the substrate by replacing the liquid agent with a rinse solution after the third step.

15. A substrate processing method comprising:
    a first step of supplying a liquid agent onto a main surface of a substrate;
    a second step of bringing an upper surface of a film of the liquid agent in contact with a liquid agent holding member which faces the substrate in order to hold the liquid agent between the substrate and the liquid agent holding member;

a third step of moving at least one element of the substrate and the liquid agent holding member in parallel to the main surface of the substrate thereby causing relative movement between the substrate and the liquid agent holding member, while holding the liquid agent in contact with the liquid agent member which faces the substrate, in order to treat uniformly the main surface of the substrate with the liquid agent; and wherein the relative movement between the substrate and the liquid agent holding member causes the liquid to be stirred.

* * * * *

UNITED STATES PATENT AND TRADEMARK OFFICE
CERTIFICATE OF CORRECTION

PATENT NO.     : 6,265,323 B1  
DATED          : July 24, 2001  
INVENTOR(S)    : Hiroko Nakamura et al.

It is certified that error appears in the above-identified patent and that said Letters Patent is hereby corrected as shown below:

<u>Column 18,</u>
Line 12, "at a sandstill" should read -- at a standstill --.

Signed and Sealed this

Fourth Day of June, 2002

*Attest:*

JAMES E. ROGAN
*Attesting Officer*     *Director of the United States Patent and Trademark Office*